United States Patent
Nagata et al.

(10) Patent No.: US 7,518,681 B2
(45) Date of Patent: Apr. 14, 2009

(54) MANUFACTURING APPARATUS FOR ORIENTED FILM, LIQUID CRYSTAL DEVICE AND ELECTRONIC DEVICE

(75) Inventors: Yasushi Nagata, Mitaka (JP); Yuichi Shimizu, Hokuto (JP)

(73) Assignee: Seiko Epson Corporation (JP)

( * ) Notice: Subject to any disclaimer, the term of this patent is extended or adjusted under 35 U.S.C. 154(b) by 130 days.

(21) Appl. No.: 11/484,490

(22) Filed: Jul. 11, 2006

(65) Prior Publication Data

US 2007/0013845 A1   Jan. 18, 2007

(30) Foreign Application Priority Data

Jul. 14, 2005   (JP)   ............................. 2005-205468

(51) Int. Cl.
*G02F 1/1337*   (2006.01)
(52) U.S. Cl. ...................................... 349/124; 349/125
(58) Field of Classification Search .................. 349/124, 349/125
See application file for complete search history.

(56) References Cited

U.S. PATENT DOCUMENTS

| | | | | |
|---|---|---|---|---|
| 5,490,910 | A * | 2/1996 | Nelson et al. | 204/192.15 |
| 5,609,721 | A * | 3/1997 | Tsukune et al. | 134/22.11 |
| 5,622,567 | A * | 4/1997 | Kojima et al. | 118/726 |
| 5,893,962 | A * | 4/1999 | Mizuno et al. | 118/723 E |
| 6,070,552 | A * | 6/2000 | Mizuno et al. | 118/723 E |
| 6,089,183 | A * | 7/2000 | Imai et al. | 118/723 E |
| 6,110,291 | A * | 8/2000 | Haruta et al. | 118/726 |
| 6,132,512 | A * | 10/2000 | Horie et al. | 118/715 |
| 6,282,368 | B1 * | 8/2001 | Horie et al. | 392/394 |
| 6,737,666 | B1 | 5/2004 | Ito et al. | |
| 2001/0047764 | A1 * | 12/2001 | Cook et al. | 118/730 |
| 2003/0045131 | A1 * | 3/2003 | Verbeke et al. | 438/795 |
| 2004/0173314 | A1 * | 9/2004 | Nishio et al. | 156/345.33 |
| 2004/0187451 | A1 * | 9/2004 | Suzuki et al. | 55/385.1 |
| 2004/0221809 | A1 * | 11/2004 | Ohmi et al. | 118/715 |
| 2005/0003600 | A1 * | 1/2005 | Kasai et al. | 438/200 |
| 2005/0034810 | A1 | 2/2005 | Yamazaki et al. | |
| 2005/0087305 | A1 * | 4/2005 | Nishio et al. | 156/345.51 |
| 2006/0011131 | A1 * | 1/2006 | Otsuki et al. | 117/98 |

FOREIGN PATENT DOCUMENTS

| | | |
|---|---|---|
| JP | 62-189428 | 8/1987 |
| JP | 2001-152341 | 6/2001 |
| JP | 2002-057120 | 2/2002 |
| JP | 2002-365639 | 12/2002 |
| JP | 2004-307976 | 11/2004 |
| JP | 2005-129299 | 5/2005 |

* cited by examiner

*Primary Examiner*—K. Cyrus Kianni
(74) *Attorney, Agent, or Firm*—Harness, Dickey & Pierce, P.L.C.

(57) ABSTRACT

A manufacturing apparatus for manufacturing an oriented film of a liquid crystal device holding a liquid crystal between a pair of substrates facing each other, includes: a film formation chamber; an evaporation section evaporating an oriented film material on the substrate by a physical vapor deposition, and forming the oriented film in the film formation chamber; a shielding plate formed between the evaporation section and the substrate, having an elongated opening for selectively evaporating the oriented film material, and covering an area of the substrate on which the oriented film is not formed; and a cleaning section providing a cleaning medium for removing the oriented film material adhered on the shielding plate, toward the opening of the shielding plate, and on the side of the shielding plate that faces the evaporation section.

9 Claims, 7 Drawing Sheets

MANUFACTURING APPARATUS FOR ORIENTED FILM, LIQUID CRYSTAL DEVICE AND ELECTRONIC DEVICE

CROSS-REFERENCE TO RELATED APPLICATION

This application claims priority on Japanese Patent Application No. 2005-205468, filed Jul. 14, 2005, the contents of which are incorporated herein by reference.

BACKGROUND

1. Technical Field

The present invention relates to a manufacturing apparatus for an oriented film, a liquid crystal device, and an electronic device.

2. Related Art

A liquid crystal device has been used as a photo-modulation section in a projection display device such as a liquid crystal projector, etc.

Such a liquid crystal device includes a sealant arranged at the periphery between a pair of substrates and a liquid crystal layer sealed at its center.

Electrodes for applying a voltage to the liquid crystal layer are formed on the side of an inner surface of the pair of substrates, and an oriented film for controlling the orientation of liquid crystal molecules when applying a non-selective voltage is formed on the side of the inner surface of the electrodes.

By such a constitution, the liquid crystal device modulates the light of a light source based on the orientation change of the liquid crystal molecules when applying a non-selective voltage or selective voltage to form the light of an image.

An oriented film subjected to a rubbing treatment is generally used as the above-mentioned oriented film on the surface of a polymer film made of polyimides to which a side-chain alkyl group, etc, has been added.

The rubbing treatment section of a polymer is oriented in a pre-determined direction by rubbing the surface of a polymer film in a pre-determined direction with a roller having a soft cloth.

Liquid crystal molecules are arranged along an orienting high polymer due to an intermolecular interaction between the orienting high molecules and the liquid crystal molecules.

Therefore, liquid crystal molecules can be oriented in a pre-determined direction, when a non-selective voltage is applied.

A pre-tilt can be given to a liquid crystal molecule by a side-chain alkyl group.

However, when a liquid crystal device fitted with such an organic oriented film is adopted as the photo-modulation section of a projector, there is concern that the oriented film will gradually degrade due to strong light radiated from a light source or heat.

There is further concern that the orientation control function of liquid crystal molecules is reduced and the display quality of the liquid crystal projector will deteriorate after extended use, e.g., the liquid crystal molecules cannot be arrayed at a desired pre-tilt angle.

Accordingly, the use of an oriented film made of an inorganic material excellent in light resistance and heat resistance has been proposed.

As a manufacturing method for such an inorganic oriented film, for example, a silicon oxide ($SiO_2$) film formed by an oblique evaporation process is known.

When an inorganic oriented film is formed by the oblique evaporation process, it is necessary to control the incidence angle of an oriented film material to form the oriented film in a desired oriented state.

As a technique for controlling the incidence angle of an orientation material, Japanese Unexamined Patent Application, First Publication No. 2002-365639 is known.

According to this technique, a shielding plate having a slit is arranged between an oriented film material and a substrate, through which a desired oriented film is formed by selective evaporation at a pre-determined incidence angle.

However, in the above described technique, the oriented film material is evaporated not only on the substrate but also on the shielding plate, so that a width of the slit of the shielding plate is narrowed after extended evaporating.

By this means, an evaporating condition including the incidence angle regulated by the slit of the shielding plate is changed compared with an initial evaporating condition, irregularities of evaporation or the like occur, and a desired oriented film cannot be obtained.

Furthermore, the oriented film material is adhered in the vicinity of the slit of the shielding plate. If the evaporating is continued in this state, adherent evaporants become floatable particles and adhere to the oriented film. There is concern that the film performance such as the orientation control function is degraded because of this.

To avoid such a disadvantage, it is necessary to frequently perform maintenance on the inside of the apparatus such as changing the shielding plate. However, in this case, there is a new disadvantage such that productivity is lowered.

This is because no matter how the evaporation is performed, while setting the pressure of the inside of the apparatus vacuum, when maintenance for the inside of the apparatus is performed, it is necessary to revert the pressure of the inside apparatus from that of a vacuum to that of the atmosphere.

Therefore, it is necessary to revert the pressure to that of a vacuum by suctioning the air from the inside of the apparatus for performing the evaporation again after maintenance.

However, suctioning the air from the inside of the apparatus takes time. For example, in the case of evaporating a large substrate from which a plurality of substrates is taken, the evaporating apparatus must be large, and there is a substantial need for ten hours to one day to suction the air from the inside of the evaporating apparatus.

Furthermore, in the case of changing the used shielding plate to a new shielding plate, test-evaporation must be performed after changing the shielding plate due to the lowered stability of the initial evaporation. Therefore, there is a problem in that productivity is lost.

SUMMARY

A first aspect of the invention provides a manufacturing apparatus for manufacturing an oriented film of a liquid crystal device holding a liquid crystal between a pair of substrates facing each other, including: a film formation chamber; an evaporation section evaporating the oriented film material on the substrate by a physical vapor deposition, and forming the oriented film in the film formation chamber; a shielding plate formed between the evaporation section and the substrate, having an elongated opening for selectively evaporating the oriented film material, and covering an area of the substrate on which the oriented film is not formed; and a cleaning section providing a cleaning medium for removing the oriented film material adhered on the shielding plate, toward the opening of the shielding plate, and on the side of the shielding plate that faces the evaporation section.

According to this manufacturing apparatus, it is possible to remove the oriented film material adhered to the shielding plate by the cleaning section when maintenance for the apparatus is performed, while also maintaining the inside of the film formation chamber in a vacuum state.

Therefore, it is possible to revert the evaporating condition to an initial evaporating condition and prevent the degradation of the film performance such as the orientation control function of the oriented film by removing the oriented film material adhered to the inner-edge of the shielding plate in the vicinity of the openings thereof.

Furthermore, it is possible to prevent the adhering of floatable particles adhered on the shielding plate to the oriented film.

Thus, it is also possible to prevent the degradation of the film performance such as the orientation control function of the oriented film.

In the above-described maintenance, since the cleaning of the shielding plate can be performed while maintaining a vacuum inside the film formation chamber, it is possible to omit the operation of reverting the pressure of the inside film formation chamber from that of the vacuum to that of the atmosphere once, and next setting the pressure from that of the atmosphere to that of the vacuum.

Therefore, it is possible to remarkably improve productivity by avoiding the operation of reverting the pressure to that of a vacuum.

It is preferable that, in the manufacturing apparatus for manufacturing the oriented film of the first aspect of the invention, the cleaning medium be a reactant gas removing the oriented film material from the shielding plate by a chemical reaction between the cleaning medium and the oriented film material.

By using such reactant gas, it is possible to desirably remove the oriented film material adhered to the shielding plate and selectively remove the oriented film material.

It is preferable that, in the manufacturing apparatus for manufacturing the oriented film of the first aspect of the invention, the cleaning medium be solid particulates removing the oriented film material from the shielding plate by carrying out physical removal of the oriented film material.

By using such the solid particulates, it is possible to desirably remove the oriented film material adhered to the shielding plate.

It is preferable that, in the manufacturing apparatus for manufacturing the oriented film of the first aspect of the invention, the cleaning section be movable relative to the opening of the shielding plate.

By this means, it is possible to reliably remove the oriented film material adhered to the inner-edge of the openings of the shielding plate and in the vicinity thereof by moving the cleaning section forward relative to the opening of the shielding plate and the cleaning of the shielding plate is performed.

To prevent interrupting the evaporation, the cleaning section is moved backward relative to the opening of the shielding plate. This also prevents the adhering of the oriented film material to the shielding plate itself when forming the oriented film by evaporation.

It is preferable that the manufacturing apparatus for manufacturing the oriented film of the first aspect of the invention, further include: a process-completion detector for detecting a completion of processing by determining when the removal of the oriented film material adhered on the shielding plate is finished.

In this manner, the completion of processing by determining when the removal of the oriented film material by the process-completion detector and by finishing the cleaning of the shielding plate at the same time, it is possible to prevent damage to the shielding plate or time loss due to over-cleaning the shielding plate.

A second aspect of the invention provides a liquid crystal device including the oriented film manufactured by the above-described manufacturing apparatus.

With regard to the liquid crystal device, since the degradation of the film performance such as the orientation control function of the oriented film can be prevented as described above, the liquid crystal device itself also has desirable qualities.

Furthermore, since productivity of manufacturing the oriented film can be improved, productivity of manufacturing the liquid crystal device can be also improved.

A third aspect of the invention provides an electronic device including the above-described liquid crystal device.

Thus, since the electronic device includes the liquid crystal device having desirable qualities and improved productivity, the electronic device also has desirable qualities and improved productivity.

DESCRIPTION OF EXEMPLARY EMBODIMENTS

The invention is described in detail hereafter, with reference to the drawings below.

Figure 1A:
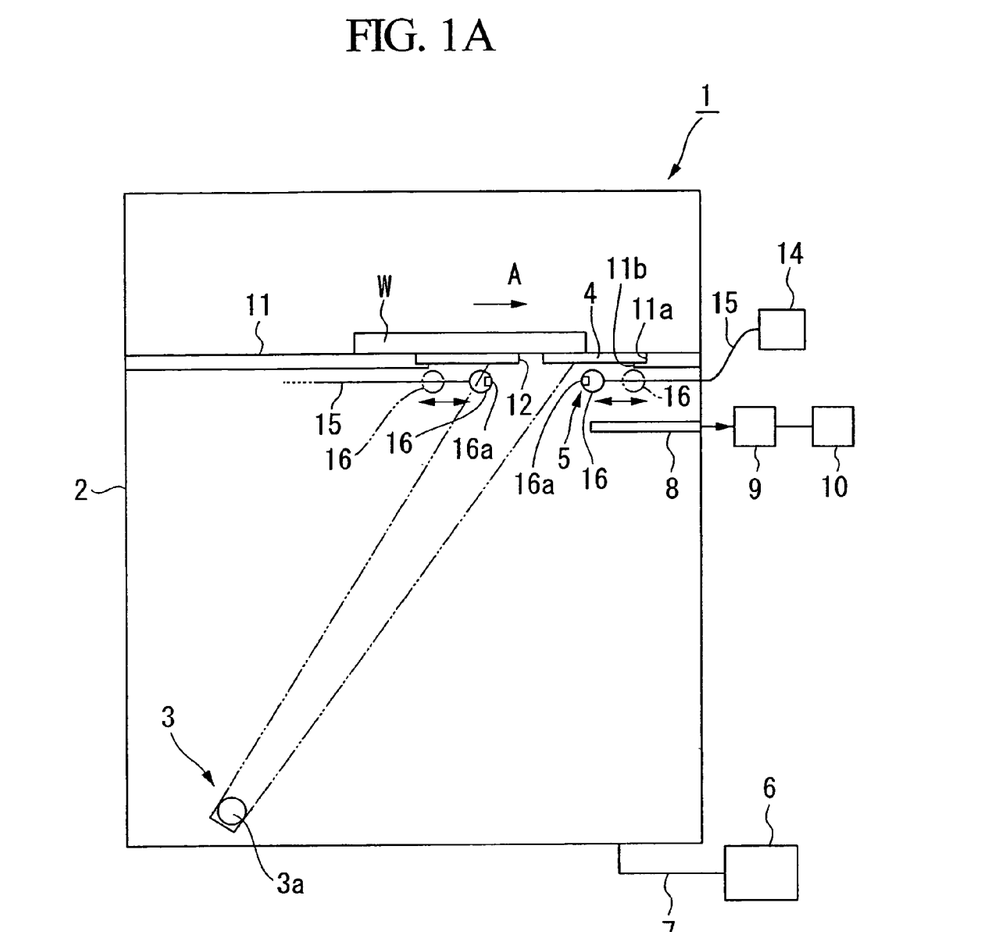
FIG. 1A is a cross-sectional view of an embodiment of the manufacturing apparatus of this invention.
Figure 1B:
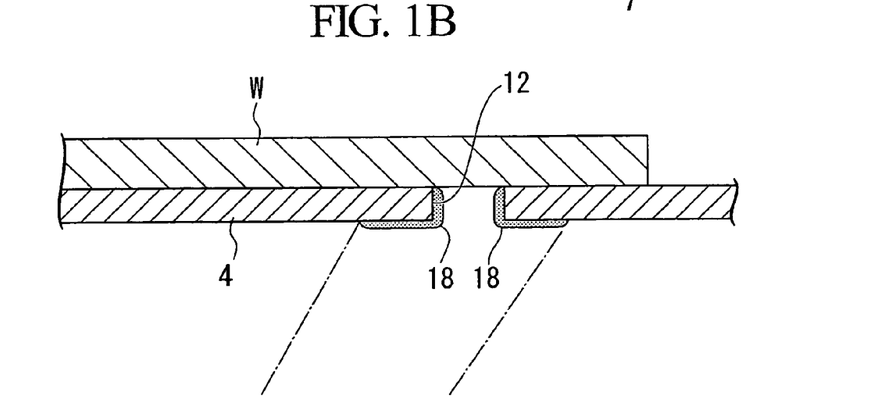
FIG. 1B is a cross-sectional view of a part of the manufacturing apparatus of this invention.

FIG. 1A is a cross-sectional view of an embodiment of the manufacturing apparatus of this invention, and FIG. 1B is a cross-sectional view of a part of the manufacturing apparatus of this invention.

In FIG. 1, reference numeral 1 represents a manufacturing apparatus for manufacturing an oriented film (hereinafter referred to as the manufacturing apparatus).

The manufacturing apparatus 1 forms an oriented film made of an inorganic material on the surface of a substrate W constituting a constituent member of the liquid crystal device.

The manufacturing apparatus 1 includes a film formation chamber 2 constituted as a vacuum chamber, an evaporating section 3 for sublimating an inorganic material of which the oriented film material is made, a shielding plate 4 arranged between the evaporating section 3 and the substrate W, and a cleaning device 5 (cleaning section) cleaning of the shielding plate 4.

The film formation chamber 2 communicates with a pre-processing chamber (not shown) in which the substrate W is subjected to a pretreatment for the forming of the oriented film (e.g., heating treatment for substrate W) and with a post-processing chamber (not shown) in which the substrate W is subjected to an after-treatment for the forming of the oriented film (e.g., cooling treatment for substrate W).

Gate valves tightly isolating the film formation chamber 2 from the pre-processing chamber and from the post-processing chamber are provided.

In such a constitution, it is possible to transfer the substrates W from the pre-processing chamber to the film formation chamber 2, and is possible to transfer the substrates W from the film formation chamber 2 to the post-processing chamber, without greatly lowering the vacuum in the film formation chamber 2.

A vacuum pump 6 for controlling the inner pressure to obtain a desired vacuum state is connected to the film formation chamber 2 via a pipe 7.

In addition, a suction pipe 8 is placed on the inner wall of the film formation chamber 2. In this embodiment, a first end of the suction pipe 8 is extended from the inner wall of the film formation chamber 2 toward the vicinity of the cleaning device 5, and a second end of the suction pipe 8 is connected to a Fourier Transform Infrared Spectrometer (FT-IR) 9 as an process-completion detector placed outside of the film formation chamber 2. Furthermore, the suction pipe 8 is connected to a suction pump 10.

A transporting section (not shown) is connected to the film formation chamber 2. The transporting section receives the substrate W from the pre-processing chamber, continuously or intermittently transports the substrates W in the film formation chamber 2, and sends the substrates W out from the film formation chamber 2 toward the post-processing chamber, as shown by arrow direction A in FIG. 1A.

The evaporating section 3 is arranged at the bottom of the film formation chamber 2 and at the side of the inner wall of the film formation chamber 2.

The evaporating section 3 evaporates the inorganic material, which becomes the oriented film material on the substrates W by a physical vapor deposition process, i.e., an evaporation process or a sputtering process such as an ion beam sputtering process, etc. to form the oriented film.

In this embodiment, the evaporating section 3 includes an evaporating source 3a made of the inorganic material and an electron beam gun unit (not shown) which radiates an electron beam on the evaporating source 3a to heat and sublimate the inorganic material.

Here, silicon oxide (SiOx) such as silicon dioxide ($SiO_2$) or the like is used as the inorganic material and becomes the oriented film material in this embodiment.

In the evaporating section 3, the opening of a crucible (not shown) holding the evaporating source 3a is arranged so as to face an opening of the shielding plate 4 as described later, thereby the evaporating section 3 selectively sublimates and deposits an evaporant of the inorganic material in a direction shown by a double chain line in FIG. 1A.

The shielding plate is attachably/detachably held and fixed at a transporting plate 11 installed in the film formation chamber 2 and is made of a metal, ceramic, resin, or the like.

The transporting plate 11 holds the substrate W on or above the upper face of the transporting plate 1, and allows the substrate W to be movable as shown by the arrow direction A in FIG. 1A by the transporting section (not shown).

An opening 11a holding the shielding plate 4 is formed in the transporting plate 11. The opening 11a is positioned at a side of an inner wall opposite of which the 20 evaporating section 3 is arranged.

A holding portion 11b extending from a wall of the opening 11a to the inside of the opening 11a is formed in the opening 11a of the transporting plate 11.

By this means, the shielding plate 4 is held and fixed on the transporting plate 11 by using, for example, screws or the like, while the shielding plate 4 is fit into the opening 11a and is mounted on the holding portion 11b.

Furthermore, an elongated opening 12 having pre-determined width is formed on the shielding plate 4.

An extending direction of the opening 12 is orthogonally positioned to the direction for transporting the substrate W (arrow direction A) by properly arranging the shielding plate 4 relative to the substrate W. The opening 12 is used for the oriented film material sublimated from the evaporating section 3 so that the oriented film material is selectively evaporated on the substrate W.

Furthermore, the opening 12 is arranged so as to set an angle between the surface of the substrate W exposed by the opening 12 and a sublimating direction from the evaporating source 3a to the opening 12, in a pre-determined angle range.

Hence, the sublimate (evaporant) of the oriented film material is obliquely evaporated at a pre-determined angle to the film formation surface of the substrate W.

On the other hand, the shielding plate 4 covers a non-oriented film formation area other than the film formation area prescribed by the opening 12 by covering the bottom surface side of the substrate W.

The shielding plate 4 prevents the inorganic material from evaporating onto the non-oriented film formation area.

However, since the substrate W moves onto the opening 12, the oriented film material can be obliquely evaporated over the film formation area by placing the entire film formation area (oriented film formation area) of the substrate W over the opening 12.

Furthermore, the cleaning device 5 removing the oriented film material (evaporant) adhered to the shielding plate is provided in the film formation chamber 2.

The cleaning device 5 includes a providing source 14 for a cleaning medium, a flexible pipe 15 connected to the providing source 14, and medium providing pipes 16 connected to the flexible pipe 15.

Figure 2:
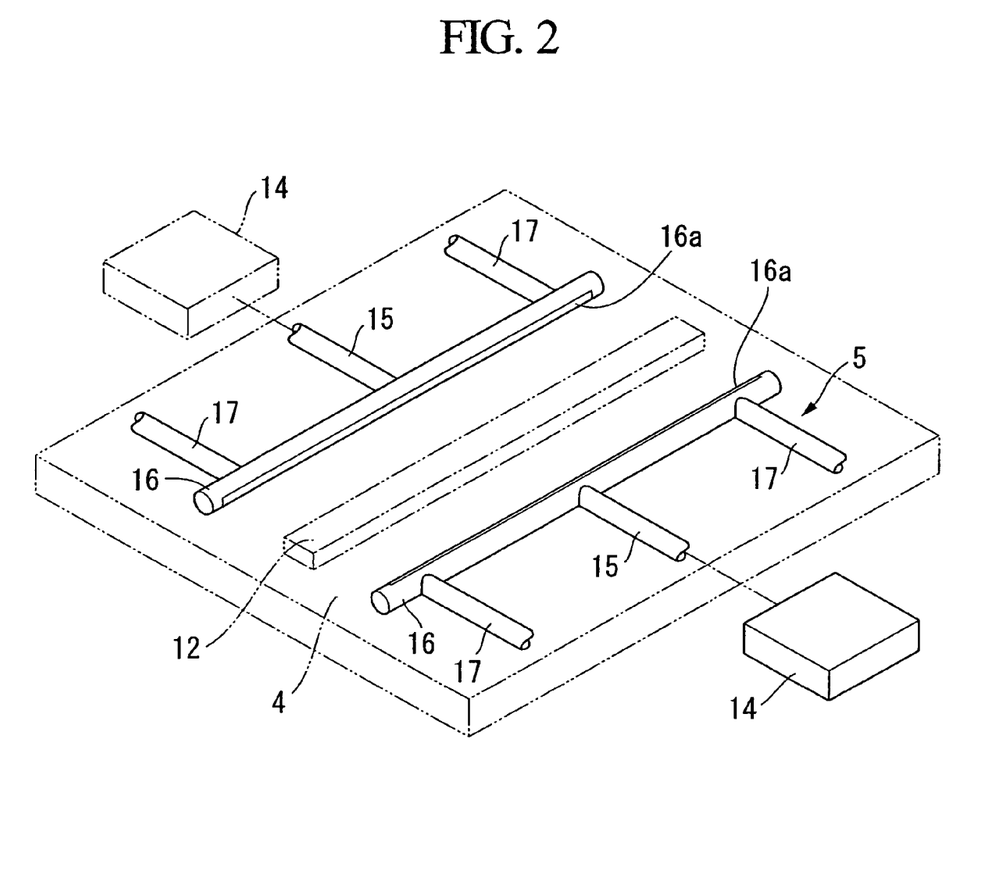
FIG. 2 is a perspective view for describing a schematic block diagram of the cleaning section.

The medium providing pipes 16 are arranged above the surface of the shielding plate 4 to which the evaporating section 3 is faced, and in vicinity of the opening 12. The medium providing pipes 16 are canaliform-shaped, extending along a length direction (extending direction) of the opening 12 and are arranged on both sides of the opening 12, as shown in FIG. 2.

Providing outlet 16a is formed in each of the medium providing pipes 16 and along the length direction of the medium providing pipe 16, thus also along the length direction of the opening 12.

The medium providing pipe 16 supplies the cleaning medium toward the opening 12 (in the vicinity of the opening 12) of the shielding plate 4 by ejecting or by spraying the cleaning medium from the providing outlet 16a.

The cleaning medium which is stored or generated in the providing source 14 is sent out from the providing source 14 to the medium providing pipe 16 by a flue pump or the like, and is supplied from the providing outlet 16a to a side of the shielding plate 4 via the flexible pipe 15.

As the cleaning medium in this embodiment, preferably a reactant gas chemically reacting relative to the oriented film material adhered to the shielding plate 4 is used, thereby removing the oriented film material from the shielding plate 4.

The reactant gas used as the cleaning medium is properly selected corresponding to the type of the oriented film material.

In this embodiment, since a silicon oxide such as $SiO_2$ or the like is used as the oriented film material, a reactant gas that chemically reacts relative to the silicon oxide is used as the reactant gas, thereby obtaining a reactant for gasifying and removing the oriented film material from the shielding plate 4.

Specifically, gasses or radicals activated from PFC (perfluorocompound) gasses by plasma such as $CF_4$, $C_2F_6$, $NF_3$ or the like, and light excitation gasses activated from gasses by radiation of ultraviolet rays such as $Cl_2$, $(F_2/H_2)$ or the like, further gasses having high reactivity relative to the $SiO_2$ such as HF or the like, may be preferably used.

These gasses such as described above are supplied from the medium providing pipe 16 to the shielding plate 4, if necessary the gas is activated by plasma or ultraviolet rays, thereby the reactant gas is chemically reacted with silicon oxide such as $SiO_2$ or the like used as the oriented film material, these are gasified as, for example, silicon fluoride $(SiF_4)$, the oriented film material is removed from the shielding plate 4.

Here, a generator for generating plasma or a radiator for radiating ultraviolet rays may be provided inside of or outside of the film formation chamber 2.

Furthermore, the cleaning device 5 includes a forward/backward mechanism (not shown) moving the medium providing pipe 16 forward/backward relative to the opening 12.

The forward/backward mechanism is provided by holding rods 17 holding both ends of the medium providing pipe 16 as shown in FIG. 2, and air cylinders (not shown) connected to the rods 17. The air cylinders are arranged, for example, outside of the film formation chamber 2 and move the rods 17.

Here, with regard to the moving of the medium providing pipe 16 forward/backward relative to the opening 12 by the forward/backward mechanism, the medium providing pipe 16 is moved forward relative to the opening 12 when the cleaning of the shielding plate 4 is performed, the medium providing pipe 16 is moved backward relative to the opening 12 when the evaporating of the oriented film is performed, as described later.

In the case in which reactant gas including fluorine (F) is used as the cleaning medium, the Fourier Transform Infrared Spectrometer (FT-IR) 9 functions as the process-completion detector detecting the completion of processing by determining when the removal of the oriented film material adhered on the shielding plate 4 is finished.

Thus, gas including F such as FPC is reacted with silicon oxide used as the above-described oriented film material, silicon fluoride $(SiF_4)$ is produced, and the silicon fluoride is inducted to the Fourier Transform Infrared Spectrometer (FT-IR) 9 via the suction pipe 8 by the operation of the suction pump 10.

The Fourier Transform Infrared Spectrometer (FT-IR) 9 detects the amount of silicon fluoride $(SiF_4)$, and detects the completion of the cleaning as described later.

Next, the manufacturing method for the oriented film by the manufacturing apparatus 1 and maintenance for the manufacturing apparatus 1 are described.

First, the inside of the film formation chamber 2 is regulated to a vacuum state by operating the vacuum pump 6 and the inside of the film formation chamber 2 is regulated to a desired temperature by a heater (not shown).

In addition, the medium providing pipe 16 is moved backward relative to the opening 12 by the forward/backward mechanism of the cleaning device 5 as shown by a double chain line in FIG. 1A.

Successively, the substrate W on which pretreatment (e.g., heating treatment or the like) has been applied is transferred into the film formation chamber 2.

Then, the transporting section continuously or intermittently transports the substrates W as shown by arrow direction A in FIG. 1A.

In addition, the evaporating section 3 is separately operated to sublimate and deposit an oriented film material toward an area shown by a double chain line in FIG. 1A.

While sublimating the oriented film material such as above, the substrate W is moved on the transporting plate 11, the substrate W is reached on the shielding plate 4, and film formation surface of the substrate W is exposed via the opening 12.

In this case, since the opening 12 is arranged so as to set an angle between the surface of the substrate W exposed by the opening 12 and a sublimating direction from the evaporating source 3a to the opening 12 in a predetermined angle range, the oriented film material sublimated from the evaporating source 3a is obliquely evaporated at a pre-determined angle to the film formation surface of the substrate W.

Then, the oriented film material can be obliquely evaporated over the surface of the film formation area (oriented film formation area) of the substrate W and a desired oriented film can be formed by performing such an oblique evaporation while continuously or intermittently moving the substrate W relative to the opening 12.

However, in the formation of the oriented film by such oblique evaporation, it is almost impossible to selectively sublimate and deposit the evaporant to only the opening 12, the oriented film material 18 is generally adhered in the vicinity of the opening 12 at the bottom face of the shielding plate 4, also to the inner-edge of the opening 12.

Then, the amount of adherence of the oriented film material 18 increases depending on how long the evaporation is performed, there is concern that the film performance such as the orientation control function may degrade because of the adhered oriented film material 18.

Accordingly, in this invention, maintenance is also performed to prevent the degradation of the film performance such as the orientation control function. However, this invention is different from the prior art, it is unnecessary to exchange the shielding plate 4, thus it is needless to revert the pressure of the film formation chamber 2 to atmosphere, and the oriented film material 18 is removed from the shielding plate 4 by the cleaning device 5.

In this embodiment of the invention, after forming the oriented film on the substrate W, the pressure of the inside of the film formation chamber 2 is not reverted to atmosphere, the substrate W is transferred into the post-processing chamber, and the sublimation of the oriented film material by the evaporating section 3 stops.

The medium providing pipe 16 is moved forward relative to the opening 12 by the forward/backward mechanism of the cleaning device 5 as shown by a solid line in FIG. 1A.

Then, the reactant gas such as the cleaning medium is sent out from the providing source 14 of the cleaning device 5 to the medium providing pipe 16 via the flexible pipe 15. Also, the medium providing pipe 16 supplies the reactant gas in the vicinity of the opening 12 of the shielding plate 4 by ejecting or by spraying the reactant gas from the providing outlet 16a.

In addition, if necessary corresponding to a kind of the oriented film material, plasma is separately generated in the vicinity of the opening 12, or ultraviolet rays is separately radiated in the vicinity of the opening 12.

By this means, the activated reactant gas is supplied in the vicinity of the opening 12, and the oriented film material 18 adhered to the shielding plate and this reactant gas are chemically reacted.

Then, the reactant gas and the oriented film material 18 become for example $SiF_4$, and the oriented film material is gasified and removed from the shielding plate 4.

By this means, it is possible to remove the oriented film material 18 adhered to the shielding plate 4, to clear the shielding plate 4, and to set the slit width of the opening 12 to an initial width.

Furthermore, while performing the cleaning of the shielding plate 4, the gasses generated in the vicinity of the opening 12 are inducted and suctioned out through the suction pipe 8 by the operation of the suction pump 10.

Then, the suctioned gasses are inducted to the Fourier Transform Infrared Spectrometer (FT-IR) 9, and the amount of silicon fluoride ($SiF_4$) is detected in the suctioned gasses.

In the state in which the oriented film material 18 is adhered to the shielding plate 4, since the cleaning medium (reactant gas) and the oriented film material 18 react during by the cleaning, the produced silicon fluoride is detected.

However, in the case in which the oriented film material 18 adhered to the shielding plate is almost all removed, the silicon fluoride is reduced.

When the oriented film material 18 adhered to the shielding plate is perfectly removed, silicon fluoride is not generated and is almost undetectable.

Therefore, it is possible to desirably manage the treatment period of the cleaning, by means of determining when the silicon fluoride is hardly detected, which is regarded as the completion of the cleaning, and thus is regarded as the completion of the processing when the removal of the oriented film material 18 is finished.

Then, since the shielding plate 4 is reverted to an initial state on which the oriented film material 18 is not adhered by performing the cleaning, it is possible to desirably obtain the oriented film of which film performance is not degraded, even if the evaporation is performed again by using the shielding plate 4.

According to the constituted manufacturing apparatus 1, it is possible to remove the oriented film material 18 adhered to the shielding plate 4 by the cleaning device 5 when maintenance for the manufacturing apparatus 1 is performed, while also maintaining a vacuum state inside of the film formation chamber 2.

Therefore, it is possible to revert the evaporating condition to an initial evaporating condition, and to prevent the degradation of the film performance such as the orientation control function of the oriented film by also removing the oriented film material 18 adhered to the inner-edge of the opening 12 of the shielding plate 4.

Furthermore, it is possible to prevent the adhering of floatable particles adhered on the shielding plate 4 to the oriented film, thereby it is possible to prevent the degradation of the film performance.

In addition, in the above described maintenance, since the cleaning of the shielding plate 4 can be performed while maintaining a vacuum state inside of the film formation chamber 2, it is possible to omit the operation of reverting the pressure of the inside film formation chamber 2 from that of the vacuum to that of the atmosphere once, and setting the pressure from that of the atmosphere to that of the vacuum. Therefore, it is possible to remarkably improve productivity by avoiding the operation of setting the pressure in the vacuum.

In addition, since the adhered oriented film material 18 is removed by such cleaning, the lifetime of the shielding plate 4 is lengthened, thus it is possible to realize a reduction of cost.

Furthermore, it is possible to remove the oriented film material 18 adhered not only to the shielding plate 4 but also the inner wall of the film formation chamber 2, thereby the maintenance load can be reduced.

Furthermore, since the manufacturing apparatus 1 includes the Fourier Transform Infrared Spectrometer (FT-IR) 9 detecting the completion of the processing by determining when the removal of the oriented film material 18 has finished, and the cleaning of the shielding plate 4 is finished at the same time. It is possible to prevent damage to the shielding plate 4 or reduced productivity due to over-cleaning the shielding plate 4.

In the above described embodiment, the Fourier Transform Infrared Spectrometer (FT-IR) 9 is used as a process-completion detector. The Fourier Transform Infrared Spectrometer (FT-IR) 9 detects the silicon fluoride ($SiF_4$) as the generated product of the reactant gas and the silicon oxide used as the oriented film material 18.

For example, in the case in which gasses or radical activated from PFC gasses by plasma such as $CF_4$, $C_2F_6$, $NF_3$ or the like are used as reactant gas, a process-completion detector detecting the emission of fluoride included in the PFC gasses may be used.

In the manufacturing apparatus 1 that includes the process-completion detector, when that the cleaning is performed, the PFC gasses are spent in the reaction and the fluoride is not detected. When cleaning is finished, the PFC gasses are not spent in the reaction and exist in the film formation chamber 2, thereby high concentration of the fluoride is detected.

Therefore, it is possible to desirably manage the treatment period of the cleaning because the point when high concentration of the fluoride is detected is regarded as the completion of the cleaning, thus also regarded as the completion of the processing by determining when the removal of the oriented film material 18 is finished.

In addition, as a cleaning medium of this invention, reactant gas is used which removes the oriented film material 18 from the shielding plate 4 by chemically reacting with the oriented film material 18. However, the cleaning medium is not limited in this invention, for example, solid particulates removing the oriented film material 18 from the shielding plate 4 by carrying out physical removal of the oriented film material 18, can also be used as a cleaning medium.

As the solid particulates, dry ice is desirably used. In this case, dry-ice solid particulates are ejected from the medium providing pipe 16, and are crushed to the oriented film material 18 adhered to the inner-edge of the opening 12 or in vicinity of the opening 12. Thereby, it is possible to physically remove the oriented film material 18 from the shielding plate 4.

In addition, in the case of using such solid particulates as the cleaning medium, for example, an optical detector is used as a process-completion detector of this invention. Thus, a reflecting plate is prepared and is arranged in vicinity of the opening 12, or a shielding plate having a desirable reflecting property is prepared as the shielding plate 4.

Then, using an emission element and a photo detecting element, a light emitted from the emission element is reflected in vicinity of the opening 12, the reflected light is detected by the photo detecting element, thereby the reflected light is detected at the shielding plate 4.

If the oriented film material is adhered in the vicinity of the opening 12 of the shielding plate 4, the amount of detected light of the photo detecting element is different from the setting value due to changing a reflectance. Thereby, an adherence of the oriented film material to the shielding plate 4 is detected.

Therefore, conversely, the oriented film material is removed and the reflecting plate is exposed or the like, the amount of reflected light is obtained as the setting value.

Therefore, it is possible to desirably manage the treatment period of the cleaning, because of the point when the setting value of the reflected light is obtained is regarded as the completion of the cleaning. Thus, it is regarded as the completion of the processing by determining when the removal of the oriented film material 18 is finished.

Next, a liquid crystal device of this invention provided with the oriented film formed by the manufacturing method based on such manufacturing apparatus 1 is described.

The scale of members is suitably changed to make the members recognizable sizes in the drawings used in the following description.

Figure 3:
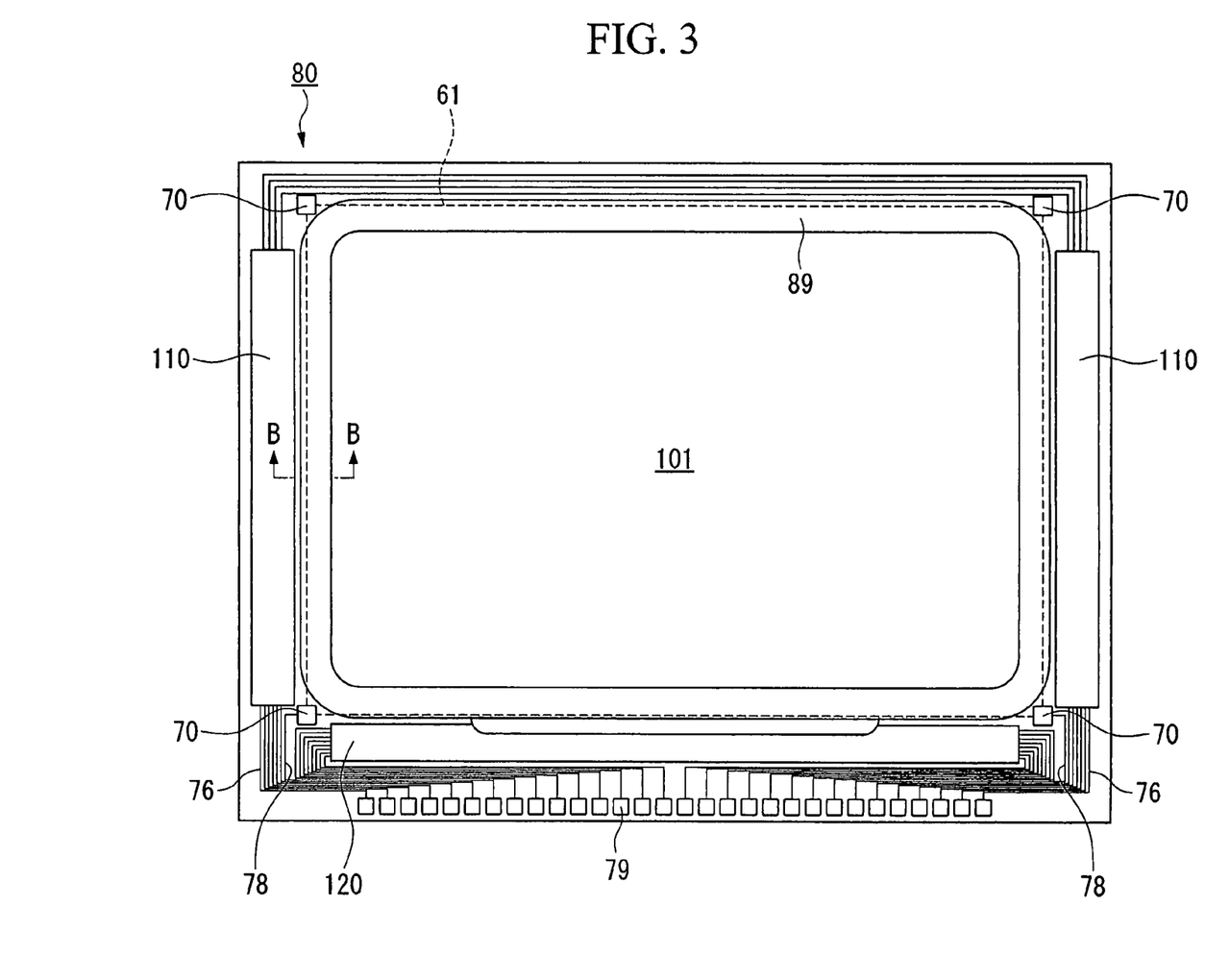
FIG. 3 is a plan view of a TFT array substrate of a liquid crystal device.

FIG. 3 is a plan view of a TFT array substrate showing a schematic constitution of an embodiment of the liquid crystal device of this invention.

Reference numeral 80 is the TFT array substrate in FIG. 3.

An image forming area 101 is formed at the center of the TFT array substrate 80.

A sealant 89 is arranged at the periphery of the image forming area 101, and a liquid crystal layer (not shown) is sealed in the image forming area 101.

The liquid crystal layer is formed by directly applying a liquid crystal onto the TFT array substrate 80, becoming a so-called seal-less structure in which an injection port of liquid crystal is not provided for the sealant 89.

Scanning line driving elements 110 for supplying a scanning signal to scanning lines described later and a data line driving element 120 for supplying an image signal to data lines described later are mounted to the outer side of the sealant 89.

Wirings 76 are drawn around from the driving elements 110 and 120 to connection terminals 79 of the end of the TFT array substrate 80.

On the other hand, a common electrode 61 (show in FIG. 6) is formed on a facing substrate 90.

This common electrode 61 is formed over nearly the entire image forming area 101, and conducting parts 70 between substrates 80 and 90 are formed at four corners thereof.

Wirings 78 are drawn from conduction parts 70 between substrates 80 and 90 to the connection terminals 79.

Then, the liquid crystal device is driven by supplying various signals input from the outside to the image forming area 101 via the connection terminals 79.

Figure 4:
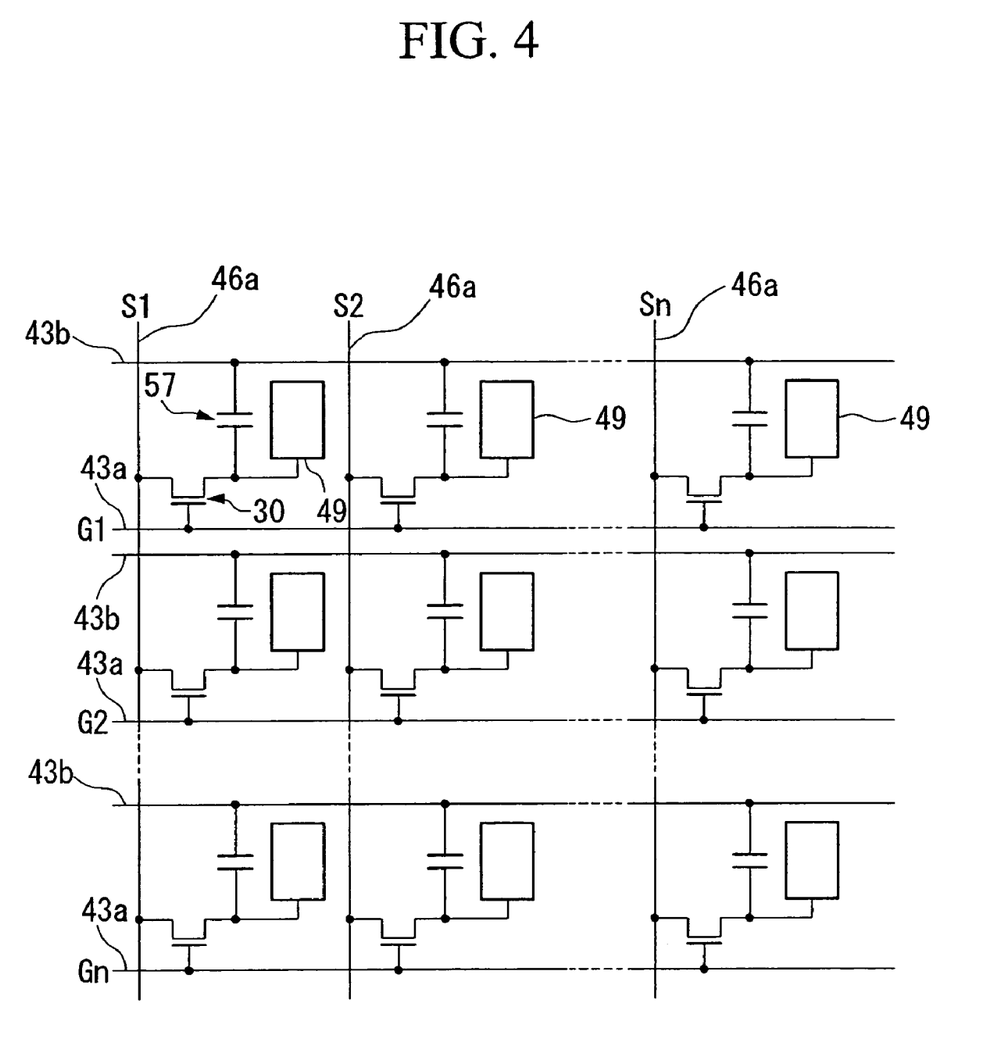
FIG. 4 is an equivalent circuit diagram of the liquid crystal device.

FIG. 4 is an equivalent circuit of the liquid crystal device.

Each of pixel electrodes 49 is formed in each of plurality of image elements arranged in an arrayed arrangement (matrix arrangement) which construct the image forming area 101 of a transmission-type liquid crystal device.

Moreover, TFT elements 30 including switch elements for performing control of energization of the pixel electrodes 49 are formed on the side portion of the pixel electrodes 49.

Data lines 46a are connected to sources of these TFT elements 30.

Image signals S1, S2, - - - , Sn are supplied from the above-mentioned data line driving element 120 to the each of data lines 46a.

Scanning lines 43a are connected to gates of the TFT elements 30.

Scanning signals G1, G2, - - - , Gm are supplied from the above-mentioned scanning line driving elements 110 to the each of scanning lines 43a in pulses at a pre-determined timing.

On the other hand, the pixel electrodes 49 are connected to drains the of TFT elements 30.

If the TFT elements 30 including switch elements are turned ON only in a given period, the image signals S1, S2, - - - , Sn supplied from the data lines 46a are written in the liquid crystal of image elements at a pre-determined timing via the pixel electrodes 49 by the scanning signals G1, G2, - - - , Gm supplied from the scanning lines 43a.

The image signals S1, S2, - - - , Sn at a pre-determined level written in the liquid crystal are held for a given period by liquid crystal capacities formed between the pixel electrodes 49 and the common electrode 61 described later.

Accumulative capacities 57 are formed between the pixel electrodes 49 and capacity lines 43b and are arranged in parallel to the liquid crystal capacities to prevent the held image signals S1, S2, - - - , Sn from leakage.

Thus, if a voltage signal is applied on the liquid crystal, the oriented state of liquid crystal molecules changes with the applied voltage level.

Thereby, light of the light source entering the liquid crystal is modulated to prepare light of an image.

Figure 5:
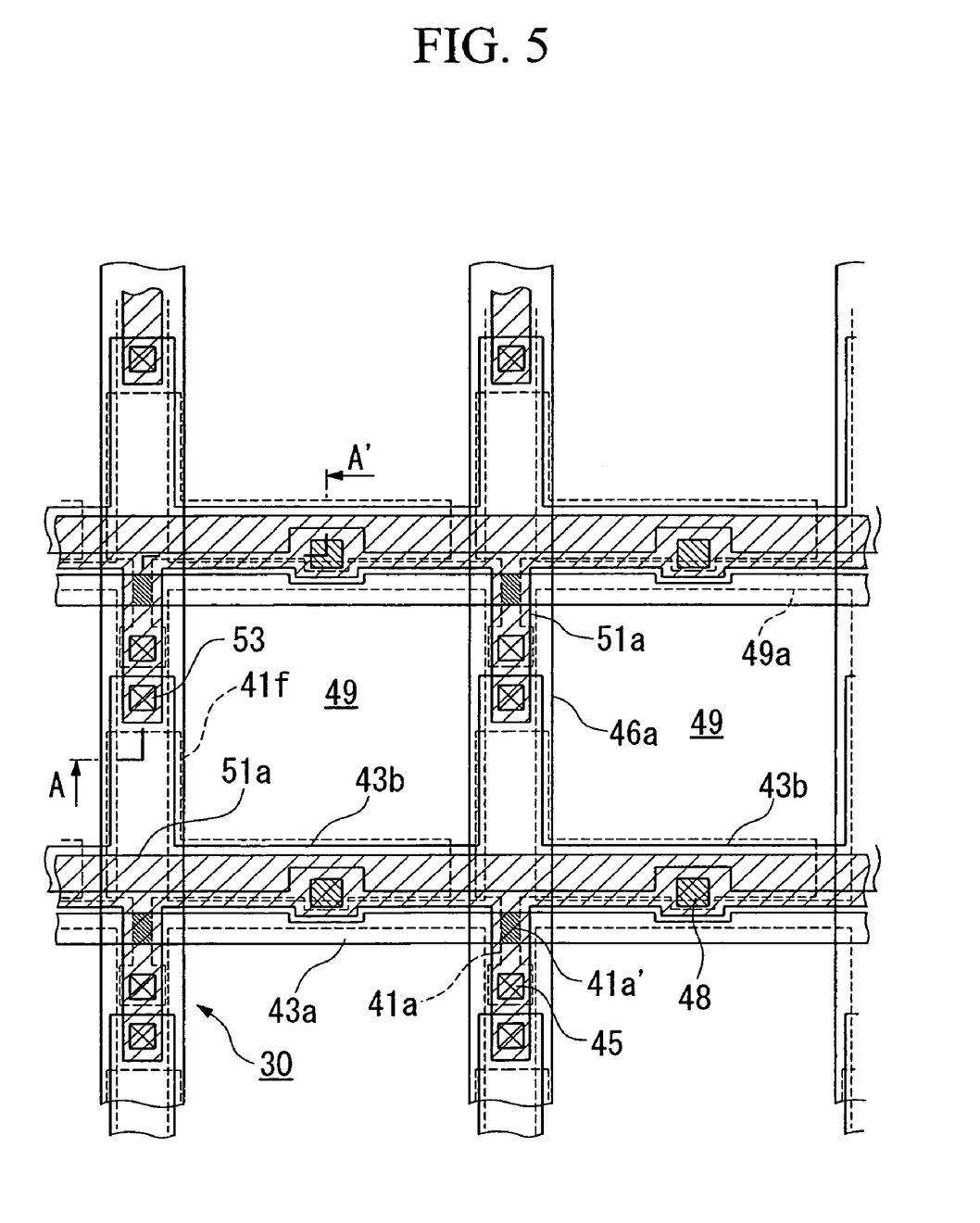
FIG. 5 is a plan view of a structure of the liquid crystal device for describing the liquid crystal device.

FIG. 5 is a plan view of the planar structure of the liquid crystal device.

In the liquid crystal device of this embodiment, rectangular pixel electrodes 49 (their contours are shown by broken lines 49a) made of a transparent conductive material, such as Indium Tin Oxide (called ITO hereafter), are arrayed in an arrayed arrangement (matrix arrangement) on a TFT array substrate.

The data lines 46a, scanning lines 43a and capacity lines 43b are provided along vertical and horizontal boundaries of the pixel electrodes 49.

In this embodiment, the rectangular area formed with the pixel electrodes 49 includes image elements and becomes a structure capable of performing a display for each dot arranged in an arrayed arrangement.

The TFT elements 30 are formed with a semiconductor layer 41a made of a polysilicon film, etc. as the center.

The data lines 46a are connected to a drain region (described later) of the semiconductor layer 41a via connector holes 45.

The pixel electrodes 49 are connected to a source region (described later) of the semiconductor layer 41a via connector holes 48.

On the other hand, a channel region 41a' is formed in a section faced to the scanning line 43a in the semiconductor layer 41a.

Figure 6:
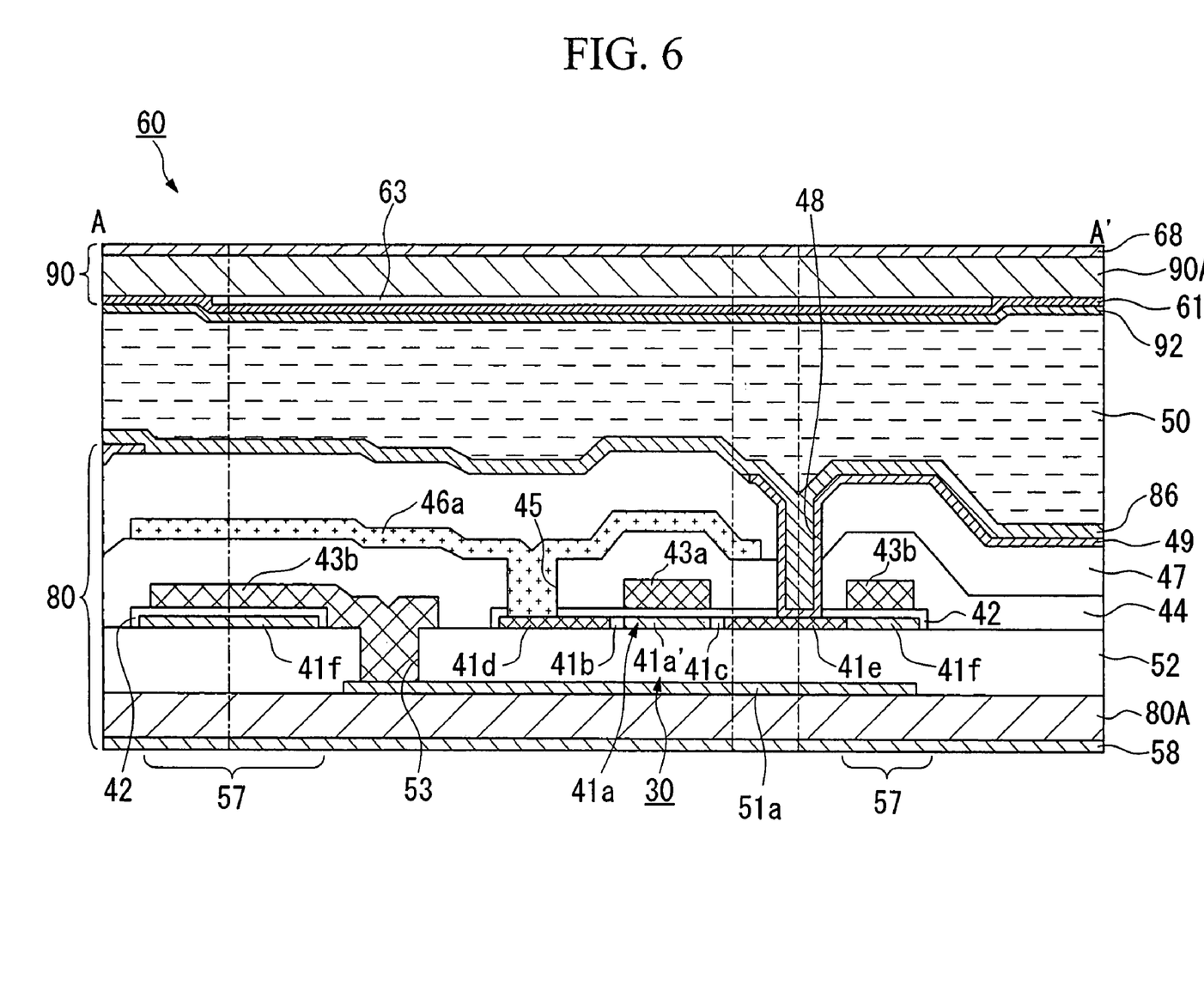
FIG. 6 is a cross-sectional view of a structure of the liquid crystal device for describing the liquid crystal device.

FIG. 6 is a cross-sectional view of a sectional structure of the liquid crystal device and is a cross-sectional view at an arrow line A-A' of FIG. 5.

As shown in FIG. 6, a liquid crystal device 60 of this embodiment is provided with a TFT array substrate 80, a facing substrate 90 arranged faced to the TFT array substrate 80, and a liquid crystal layer 50 held between the substrates 80 and 90 as the main body.

The TFT array substrate 80 is provided with the substrate body 80A made of a translucent material such as glass or quartz, the TFT element 30, the pixel electrode 49 formed at an inner side of the substrate body 80A, the inorganic oriented film 86, etc. as the main body.

On the other hand, the facing substrate 90 is provided with a substrate body 90A made of a translucent material such as glass or quartz, the common electrode 61 formed at an inner side of the substrate body 90A, the inorganic oriented film 92, etc. as main body.

A first shading film 51a and a first interlayer insulating film 52 described later are formed at the surface of the TFT array substrate 80.

Then, the semiconductor layer 41a is formed on the surface of the first interlayer insulating film 52, and the TFT element 30 is formed with this semiconductor layer 41a as the center.

The channel region 41a' is formed in a portion faced to the scanning line 43a at the semiconductor layer 41a, and a source region and a drain region are formed at both sides of the semiconductor layer 41a.

An LDD (Lightly-Doped Drain) structure is adopted in the TFT element 30, therefore a high-concentration region with a relatively high impurity concentration and a low-concentration region with a relatively low impurity concentration (LDD region) are formed in the source region and the drain region, respectively.

Therefore, a low-concentration source region 41b and a high-concentration source region 41d are formed in the source region, and a low-concentration drain region 41c and a high-concentration drain region 41e are formed in the drain region.

A gate insulating film 42 is formed on the surface of the semiconductor layer 41a.

Then, the scanning line 43a is formed on the surface of the gate insulating film 42, and a portion faced to the channel region 41a' is a gate electrode.

A second interlayer insulating film 44 is formed on the surface of the gate insulating film 42 and the scanning line 43a.

Then, the data line 46a is formed on the surface of the second interlayer insulating film 44, and the data line 46a is connected to the high-concentration source region 41d via a connection hole 45 formed on the second interlayer insulating film 44.

A third interlayer insulating film 47 is formed on the surface of the second interlayer insulating film 44 and on the data line 46a.

Then, the pixel electrode 49 is formed on the surface of the third interlayer insulating film 47, and the pixel electrodes 49 are connected to the high-concentration drain region 41d via a connection hole 48 formed in the second interlayer insulating film 44 and the third interlayer insulating film 47.

Moreover, the inorganic oriented film 86 covering the pixel electrode 49 and formed by the manufacturing apparatus 1 is formed on the pixel electrode 49, and can control the orientation of the liquid crystal molecules when applying a non-selective voltage.

In this embodiment, the semiconductor layer 41a is extended to form a first accumulative capacity electrode 41f.

The gate insulating film 42 is extended to form a dielectric film, and the capacity line 43b is arranged on the surface of the dielectric film to form a second accumulative capacity electrode.

The above-mentioned accumulative capacity 57 is constructed by the first accumulative capacity electrode 41f, the second accumulative capacity electrode (capacity line 43b), and the dielectric film (gate insulating film 42).

Furthermore, the first shading film 51a is formed on the surface of the substrate body 80A corresponding to a region forming the TFT element 30.

The first shading film 51a prevents light entering the liquid crystal device from entering into the channel region 41a', low-concentration source region 41b and low-concentration drain region 41c of the semiconductor layer 41a, etc.

On the other hand, a second shading film 63 is formed on the surface of the substrate body 90A in the facing substrate 90.

The second shading film 63 prevents light entering the liquid crystal device from entering into the channel region 41a', low-concentration source region 41b and low-concentration drain region 41c of the semiconductor layer 41a, etc., and is provided in a region overlapping with the semiconductor layer 41a in the plan view.

A common electrode 61 made of conductors such as ITO, etc. is formed over nearly the entire surface of the facing substrate 90.

Furthermore, an inorganic oriented film 92 formed by the manufacturing apparatus 1 is formed on the surface of the common electrode 61 and can control the orientation of liquid crystal molecules when applying a non-selective voltage.

Then, the liquid crystal layer 50 including of a nematic liquid crystal, etc. is held between the TFT array substrate 80 and the facing substrate 90.

These nematic liquid crystal molecules have a positive dielectric constant anisotropy, horizontally oriented along the substrate when applying a non-selective voltage, and vertically oriented along the direction of electric field when applying a selective voltage.

The nematic liquid crystal molecules have a positive index of refraction constant anisotropy, and a product of its birefringence and thickness of liquid crystal layer (retardation) And becomes, e.g., about 0.40 µm (60° C.).

The direction of orientation control based on the oriented film 86 of the TFT array substrate 80 and the direction of orientation control based on the oriented film 92 of the facing substrate 90 are set to a twisted state of about 90°.

Thereby, the liquid crystal device 60 of this embodiment is operated by a twisted nematic mode.

Polarizing plates 58 and 68 made of a material from doping iodine in polyvinyl alcohol (PVA), etc. are arranged at the outside of the two substrates 80 and 90.

It is desirable that the polarizing plates 58 and 68 be mounted on a support substrate made of a high-thermal conductivity material, such as sapphire glass or quartz, etc., and arranged apart from the liquid crystal device 60.

The polarizing plates 58 and 68 absorb linear polarization in the direction of its absorption axis and have a function of transmitting the linear polarization in the direction of its transmission axis.

The polarizing plate 58 arranged at the TFT array substrate 80 is so arranged so that its transmission axis is in substantially conformity to the direction of orientation control of the oriented film 86, and the polarizing plate 68 arranged at the facing substrate 90 is so arranged that its transmission axis is in substantially conformity to the direction of orientation control of the oriented film 92.

In the liquid crystal device 60, an outside of the facing substrate 90 is faced to the light source.

Only the linear polarization in conformity with the transmission axis of the polarizing plate 68 in the light of the light source transmits through the polarizing plate 68 and enters the liquid crystal device 60.

In the liquid crystal device 60 during the application of a non-selective voltage, the liquid crystal molecules oriented horizontally to the substrate are laminated and arranged in the form of a twisted helix of approximately 90° to the thickness direction of liquid crystal layer 50.

Therefore, the linear polarized light entering the liquid crystal device 60 exits the liquid crystal device 60 with a rotation of approximately 90°.

The linear polarized light transmits through the polarizing plate 58 because it is in conformity with the transmission axis of polarizing plate 58.

Accordingly, a white display is performed in the liquid crystal device 60 during the application of a non-selective voltage (normally white mode).

In the liquid crystal device 60 during the application of a selective voltage, the liquid crystal molecules are oriented vertically to the substrate.

Therefore, the linear polarized light entering the liquid crystal device 60 exits from the liquid crystal device 60 without rotation.

The linear polarized light does not transmit through the polarizing plate 58 because it is perpendicular to the transmission axis of polarizing plate 58.

Accordingly, a black display is performed in the liquid crystal device 60 during the application of a selective voltage.

Here, the inorganic oriented films 86 and 92 formed by the manufacturing apparatus 1 are formed on the inner side of both substrates 80 and 90 as described above.

The inorganic oriented films 86 and 92 are suitably made of silicon oxide such as $SiO_2$ or SiO as described above, but they may also be made of metal oxides such as $Al_2O_3$, ZnO, MgO, or ITO.

In the liquid crystal device 60 having such inorganic oriented films 86 and 92, since it is possible to prevent the degradation of the film performance of the oriented films 86 and 92 formed by the manufacturing apparatus 1 as described above, the liquid crystal device 60 itself also has desirable qualities.

Furthermore, since productivity of manufacturing the oriented films 86 and 92 can be improved, productivity of manufacturing the liquid crystal device 60 can be also improved.

Projector

Figure 7:
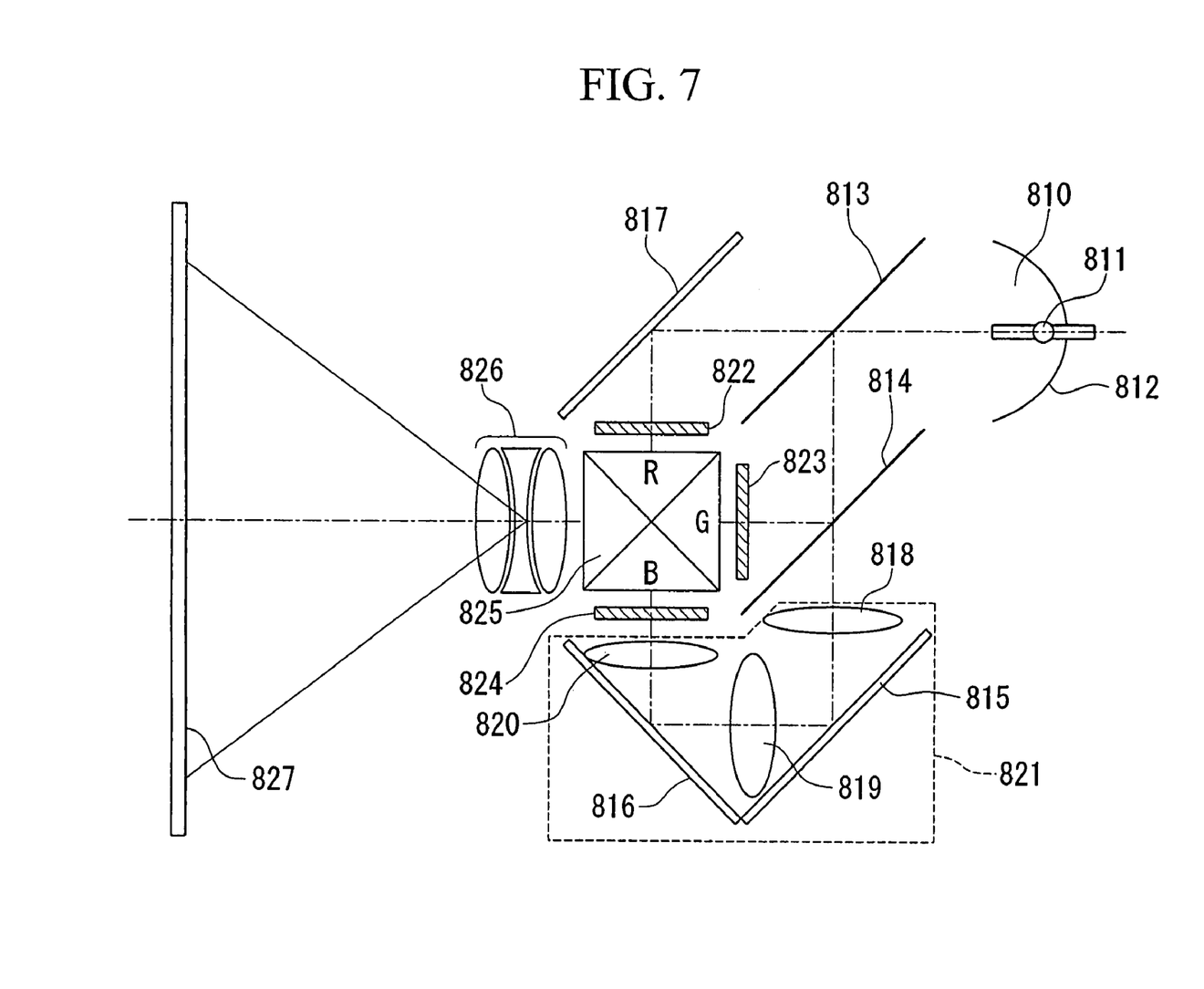
FIG. 7 is a schematic block diagram showing a projector.

An embodiment of a projector as the electronic device of this invention is described hereafter with reference to FIG. 7.

FIG. 7 is a schematic block diagram showing the projector.

The projector is provided with the liquid crystal device relating to aforesaid embodiment as a photo-modulation section.

In FIG. 7, reference numeral 810 is a light source, reference numerals 813 and 814 are dichromic mirrors, reference numerals 815, 816 and 817 are reflecting mirrors, reference numeral 818 is an entrance lens, reference numeral 819 is a relay lens, reference numeral 829 is an exit lens, reference numerals 822, 823 and 824 are photo-modulation section consisting of the liquid crystal device of invention, reference numeral 825 is a cross dichromic prism, and reference numeral 826 is a projection lens.

The light source 810 includes a lamp 811 such as a metal halide lamp, etc. and a reflector 812 for reflecting light of the lamp.

The dichromic mirror 813 transmits red light contained in white light radiated from the light source 810 and reflects blue light and green light.

The transmitted red light is reflected by the reflecting mirror 817 and enters the photo-modulation section 822 for red light.

The green light reflected by the dichromic mirror 813 is reflected by the dichromic mirror 814 and enters the photo-modulation section 823 for green light.

The blue light is reflected by the dichromic mirror 813 and transmited through the dichromic mirror 814.

A light-guiding section 821 provided with a relay lens system including the entrance lens 818, relay lens 819 and exit lens 820 is provided to prevent light loss due to a long optical path for blue light.

The blue light enters the photo-modulation section 824 for blue light.

The three color lights modulated by the photo-modulation section 822, 823 and 824 enter the cross dichromatic prism 825.

The cross dichromic prism 825 is formed by pasting four right-angle prisms.

A dielectric multi-layer film for reflecting red light and a dielectric multi-layer film for reflecting blue light are formed in the shape of X and on a boundary face of the prisms.

The three color lights are synthesized by the dielectric multi-layer films to form light expressing a color image.

The synthesized light is projected on a screen 827 by a projection lens 826 including the projection optical system.

The above-mentioned projector is provided with a liquid crystal device as the photo-modulation section.

The liquid crystal device is provided with inorganic oriented films excellent in light resistance and heat resistance as described above.

Therefore, the oriented films do not deteriorate due to strong light radiated from a light source or heat.

The liquid crystal device has desirable qualities and improved productivity, therefore the projector (electronic device) itself also has desirable qualities and improved productivity.

The technical scope of invention is not limited to the above-mentioned embodiment, and embodiments added with various modifications to the above-mentioned embodiment are also included within parameters which do not deviate from the purpose of the invention.

For example, the liquid crystal device provided with TFT as switching elements was-described as an example in the embodiment, but this invention is also applied to a liquid crystal device provided-with two-terminal elements, such as thin film diodes, etc. as switching elements.

A transmission-type liquid crystal device was described as an example in the embodiment, but it is also possible to apply this invention to a reflection-type liquid crystal device.

A liquid crystal device functioning by TN (Twisted Nematic) mode was described as an example in the embodiment, but it is also possible to apply this invention to a liquid crystal device functioning by VA (Vertical Alignment) mode.

A three-plate type projection display device was described as an example in the embodiment, but it is also possible to apply this invention to a single-plate type projection display device or a direct-view display device.

It is also possible to apply this invention to electronic devices other than the projector.

A portable telephone can be given as a specific example thereof.

The portable telephone is provided with a liquid crystal device relating to the above-mentioned embodiments or their modified examples in the display unit. As other electronic device, for example, IC card, video camera, PC computer, head-mount display, moreover, fax device with display function, finder of a digital camera, portable TV, DSP device, PDA, electronic notebook, electric light notice board, display for propagation and announcement, etc. are given.

What is claimed is:

1. A manufacturing apparatus for manufacturing an oriented film of a liquid crystal device holding a liquid crystal between a pair of substrates facing each other, comprising:
  a film formation chamber;
  an evaporation section evaporating an oriented film material on the substrate by a physical vapor deposition, and forming the oriented film in the film formation chamber;

a shielding plate formed between the evaporation section and the substrate, having an elongated opening for selectively evaporating the oriented film material, and covering an area of the substrate on which the oriented film is not formed; and a cleaning section providing a cleaning medium for removing the oriented film material adhered on the shielding plate, the cleaning section including two medium providing pipes located on opposing sides of the elongated opening and at the side of the shielding plate that faces the evaporation section.

2. The manufacturing apparatus for manufacturing the oriented film, according to claim 1, wherein the cleaning medium is a reactant gas removing the oriented film material from the shielding plate by a chemical reaction between the cleaning medium and the oriented film material.

3. The manufacturing apparatus for manufacturing the oriented film, according to claim 1, wherein the cleaning medium is solid particulates removing the oriented film material from the shielding plate by carrying out physical removal of the oriented film material.

4. The manufacturing apparatus for manufacturing the oriented film, according to claim 1, wherein the cleaning section is movable relative to the opening of the shielding plate.

5. The manufacturing apparatus for manufacturing the oriented film, according to claim 1, further comprising:

a detector for detecting the amount of fluoride or the emission of fluoride, the fluoride being the cleaning medium provided by the cleaning section into the film formation chamber.

6. A liquid crystal device comprising:
the oriented film manufactured by the manufacturing apparatus according to claim 1.

7. An electronic device comprising:
the liquid crystal device according to claim 6.

8. The manufacturing apparatus for manufacturing the oriented film, according to claim 1, further comprising:

a detector including an emission element and a photo detecting element, wherein the shielding plate is provided with a reflecting plate or has reflecting property, and wherein the detector uses the emission element and the photo detecting element, the light emitted from the emission element is reflected in vicinity of the opening of the shielding plate, the reflected light is detected by the photo detecting element, and the reflected light is detected by the photo detecting element.

9. A manufacturing apparatus for manufacturing an oriented film of a liquid crystal device holding a liquid crystal between a pair of substrates facing each other, comprising:

a film formation chamber;

an evaporation section evaporating an oriented film material on the substrate by a physical vapor deposition, and forming the oriented film in the film formation chamber;

a shielding plate formed between the evaporation section and the substrate, having an elongated opening for selectively evaporating the oriented film material, and covering an area of the substrate on which the oriented film is not formed;

a cleaning section providing a cleaning medium for removing the oriented film material adhered on the shielding plate, toward the opening of the shielding plate, and on the side of the shielding plate that faces the evaporation section; and a detector for detecting the amount of fluoride or the emission of fluoride, the fluoride being the cleaning medium provided by the cleaning section into the film formation chamber.

* * * * *